(12) United States Patent
Raleigh et al.

(10) Patent No.: US 9,249,010 B2
(45) Date of Patent: Feb. 2, 2016

(54) ELECTRICAL SHIELDING IN A MEMS LEADFRAME PACKAGE

(71) Applicant: Analog Devices, Inc., Norwood, MA (US)

(72) Inventors: Carl James Raleigh, Phoenix, AZ (US); Brian William Cousins, Somerville, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/926,726

(22) Filed: Jun. 25, 2013

(65) Prior Publication Data

US 2014/0374852 A1    Dec. 25, 2014

(51) Int. Cl.
*H01L 29/82* (2006.01)
*B81B 7/00* (2006.01)
*B81C 1/00* (2006.01)

(52) U.S. Cl.
CPC ............. *B81B 7/0064* (2013.01); *B81C 1/0023* (2013.01); *B81B 2207/012* (2013.01); *H01L 2924/3025* (2013.01)

(58) Field of Classification Search
CPC ............. H01L 2924/3025; H01L 2225/06582; H01L 2924/19105; B81B 7/0064

USPC .................................. 257/E29.324, 415, 659
See application file for complete search history.

(56) References Cited

U.S. PATENT DOCUMENTS

| 8,331,589 B2 | 12/2012 | Wu et al. .................. 381/189 |
| 2005/0101161 A1* | 5/2005 | Weiblen et al. ................. 439/37 |
| 2007/0013052 A1* | 1/2007 | Zhe et al. ...................... 257/704 |
| 2010/0207257 A1* | 8/2010 | Lee ............................... 257/660 |

FOREIGN PATENT DOCUMENTS

| EP | 2 514 713 A1 | 10/2012 | ............. B81B 7/00 |
| WO | WO 2006/085825 A1 | 8/2006 | ............. B81B 7/00 |
| WO | WO 2009/022991 A1 | 2/2009 | ............ H01L 21/48 |
| WO | WO 2009/038692 A1 | 3/2009 | ............ H01L 23/053 |

* cited by examiner

*Primary Examiner* — Howard Weiss
(74) *Attorney, Agent, or Firm* — Sunstein Kann Murphy & Timbers LLP

(57) ABSTRACT

A lead frame packaged electronic chip. The packaged electronic chip includes a MEMS device, an integrated circuit and a wire bond electrically coupling the MEMS device and the integrated circuit. The packaged electronic chip is encased in a molding material. The packaged electronic chip further includes a mechanism that shields the wire bond and the input/output pads that couple the MEMS device and the integrated circuit from electromagnetic and radio frequency interference.

17 Claims, 13 Drawing Sheets

ELECTRICAL SHIELDING IN A MEMS LEADFRAME PACKAGE

FIELD OF THE INVENTION

The invention generally relates to electrical device packaging and, more particularly, the invention relates to MEMS leadframe packaging.

BACKGROUND OF THE INVENTION

A leadframe chip scale package is a near chip scale package (CSP) having plastic encapsulated wire bonds with a conductive paddle in a package format LFCSP. The input/output pads are generally located on the outside edges of such a package. Electrical contact to a printed circuit board (PCB) is made by soldering the perimeter pads and the exposed paddle on the bottom surface of the package to the PCB. Electrical ground connections are provided through down bonds and through conductive die attach material.

MEMS devices are used in a growing number of devices, such as mobile telephones, laptop computers, voice recorders, hearing instruments, automobiles and other electronic devices. To those ends, MEMS devices such as MEMS microphone dies typically are mounted within a package interior and controlled by an adjacent integrated circuit die. The MEMS device may include a cup-shaped lid attached to the substrate to create an enclosure for the MEMS device. The interior of the cap lid enclosure forms an interior chamber that protects the fragile MEMS die from the environment.

FIG. 1 shows an exemplary LFCSP 100 in which a die 110 is attached to an electrically conductive paddle 120 using die attach 130 and/or epoxy 140. Wire bounds 150 are used to couple the die to the lead frame input/output pads 160. The die 110 is encapsulated within a molding material 170 that may be formed from a plastic or composite material that protects and insulates the die.

SUMMARY OF VARIOUS EMBODIMENTS

One embodiment of the invention discloses a packaged electronic chip. The packaged electronic chip includes a MEMS device, an integrated circuit and a wire bond electrically coupling the MEMS device and the integrated circuit. The packaged electronic chip is preferably a leadframe chip scale package chip that is encased in a molding material. The packaged electronic chip further includes a mechanism that shields the wire bond and the input/output pads that couple the MEMS device and the integrated circuit. The MEMS device includes at least one output pad outputting an alternating current signal when the MEMS device is actuated. The alternating current signal travels across the wire bond and into an input pad of the integrated circuit. The mechanism that shields the input pad, the output pad, and the wire bond creates a local voltage reference that fluctuates with electro-magnetic interference. In embodiments of the invention, the molding material covers at least a portion of the integrated circuit, the wire bond, and the MEMS device.

In embodiments of the invention, the mechanism includes a conductive paddle and a separate conductive plate that form an electrical node. The conductive plate and the conductive paddle act as a faraday cage reducing electro-magnetic interference from reaching the input pad, wirebond, and/or the output pad.

In certain embodiments MEMS device and the integrated circuit are stacked within the molding material. In other embodiments the MEMS device and the integrated circuit are arranged side-by-side. In certain embodiments of the invention the conductive plate is encapsulated in the molding material.

A grounding path may be formed between the conductive paddle, the MEMS device, the integrated circuit and the conductive plate.

Embodiments of the present invention extend to method for creating a lead frame chip scale package that includes a conductive plate coupled to a common voltage node for removing EMI and RFI from a desired signal path. The methodology for construction of such a chip scale package can employ standard lead frame processing techniques and does not require significant alteration or additional processing.

The method may include the following steps including attaching either a MEMS device and/or an integrated circuit to a lead frame using an attachment mechanism such as die attach. The MEMS device and the integrated circuit are then wire bonded together defining a signal path from the MEMS device to the integrated circuit. The MEMS device may include an electrically conductive cap for protecting the sensitive MEMS circuitry. A conductive plate is attached to either the MEMS device and/or the integrated circuit to form a voltage node that will attract EMI and RFI. The conductive plate may be positioned over the input pad of the integrated circuit. Additionally, the conductive plate may further be positioned over the wire bond and the output pad of the MEMS device. An electrical path may be formed between the conductive plate through a portion of the MEMS device and a portion of the integrated circuit to a conductive paddle that is part of the lead frame. This electrical path may be a grounding path. The methodology may further include covering the MEMS device, wire bond, and integrated circuit in a molding material to form a complete lead frame chip scale package. The electrical path may further be coupled to a ground external to the packaged chip. The packaged chip may be placed on a printed circuit board and mounted in place wherein the electrical path is coupled to a common ground of the printed circuit board or ground of some external system. The electrical path may fluctuate in voltage level in response to electromagnetic interference. In certain embodiments, the conductive plate resides completely within the molding material. In other embodiments, the conductive plate resides partially within or on top of the molding material. The conductive plate may be partially exposed through the molding material.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

Illustrative embodiments of the present invention employ a conductive plate in combination with other conductive elements to create a faraday cage to prevent stray signals and electromagnetic and radio frequency (RF) interference from coupling into the conductive path between a MEMS device and an integrated circuit that are part of the same lead frame packaged device. Because of the size of MEMS devices, the output signal from a MEMS device is often very small (e.g. exhibits small changes in output signal relative to other devices within a system). The integrated circuit that is packaged with the MEMS device often includes an amplifier for boosting the level of the signal that is received from the MEMS device. Thus, the wire bond that couples the output signal from the MEMS device to the input of the integrated circuit is especially susceptible to EMI and RF noise, which can corrupt the desired signal.

Although many of the embodiments shown in the figures show a stacked design in which a MEMS device with an electrically conductive cap is stacked on top of an integrated circuit, it should be recognized by one of ordinary skill in the art that the same inventive structure may be applied to embodiments in which the integrated circuit and the MEMS device are positioned side-by-side in a lead frame package.

Lead frame chip scale packages (LFCSP) are formed by encapsulating one or more chips within a molding material such as plastic. The LFCSP is a wire bond package with a lead frame substrate in a package format. Perimeter input/output pads are located on the outside edges of the package. Electrical contact to a printed circuit board (PCB) is made by soldering the perimeter leads and the exposed paddle on the bottom surface of the package to the PCB. Stable electrical ground connections are provided through down bonds and/or through conductive die attach material. The LFCSP has I/O pads that are designed (i.e. sized) and configured (i.e. relative placement of the I/O pads and ground pads) to mate with I/O and ground nodes on the PCB.

Figure 2:
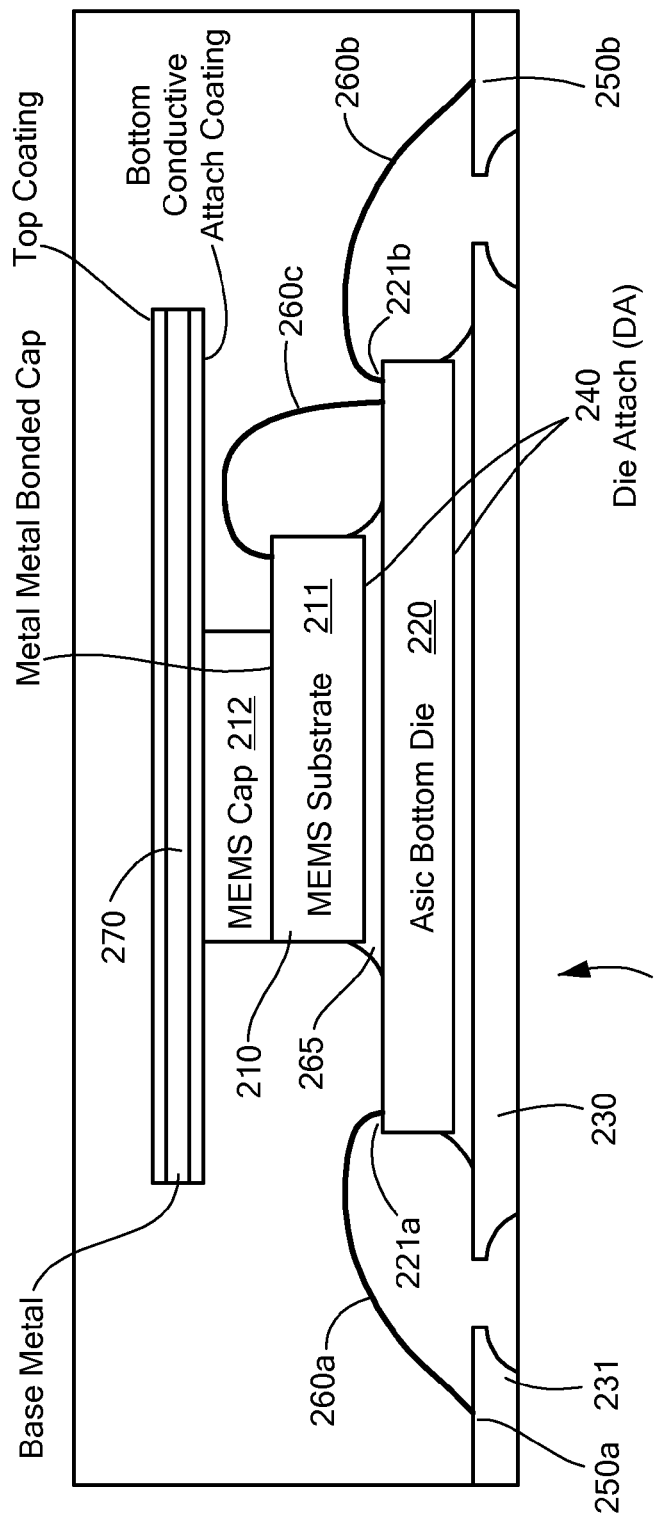
FIG. 2 shows a first embodiment of a packaged MEMS device and associated integrated circuit in which the MEMS device and integrated circuit are stacked.

FIG. 2 shows a first embodiment of a packaged electronic chip 200 including a MEMS device 210 and associated integrated circuit 220 in which the MEMS device 210 and integrated circuit 220 are stacked. As shown an integrated circuit 220 such as an application specific integrated circuit is mounted to the paddle 230 of a lead frame 231 of a lead frame package using die attach 240 as is known in the art. The die attach(es) 240 may be conductive or non-conductive or a combination thereof. The integrated circuit 220 is electrically coupled to the input/output pads 250a,b of the leadframe 231 by one or more wire bonds 260a,b,c. As shown in the figure there are a plurality of wire bonds 260a,b between the I/O pads and the integrated circuit 220. Die attach 265 is placed on the top surface of the integrated circuit 220 attaching to the MEMS substrate 211. As shown, the die attach 265 does not totally cover the integrated circuit 220 where the input and output pins 221a,b of the integrated circuit are left exposed. The MEMS device 210 may be one of many different MEMS devices, including MEMS accelerometers and MEMS microphones, for example. Other MEMS devices may also be used. In this embodiment, the MEMS substrate 211 of the MEMS device 210 is covered with a cap 212. In certain embodiments of the invention, the MEMS cap 212 is electrically conductive. On top of the MEMS cap 212 is placed a conductive plate 270. The conductive plate 270 is positioned such that the wire bonds 260c coupling the MEMS device 210 and the integrated circuit 220 are covered. This particular junction is extremely susceptible to electromagnetic and RF interference. As already indicated, the MEMS device produces a very low output signal. Thus, any noise that reaches the wire bonds between the MEMS device and that of the integrated circuit is subject to corrupting the MEMS signal. In high frequency environments, such as in the electrical systems of automobiles, these connections (wire bonds) are subjected to a great deal of noise and thus, benefit from protection.

An advantage of having the conductive plate within the molding material is that there is no metal extending outside of the package once the package is mounted to a PCB and thus, the risk of coupling an external signal into the created faraday cage and signal path between the conductive plate and the conductive paddle is reduced.

Figure 2A:
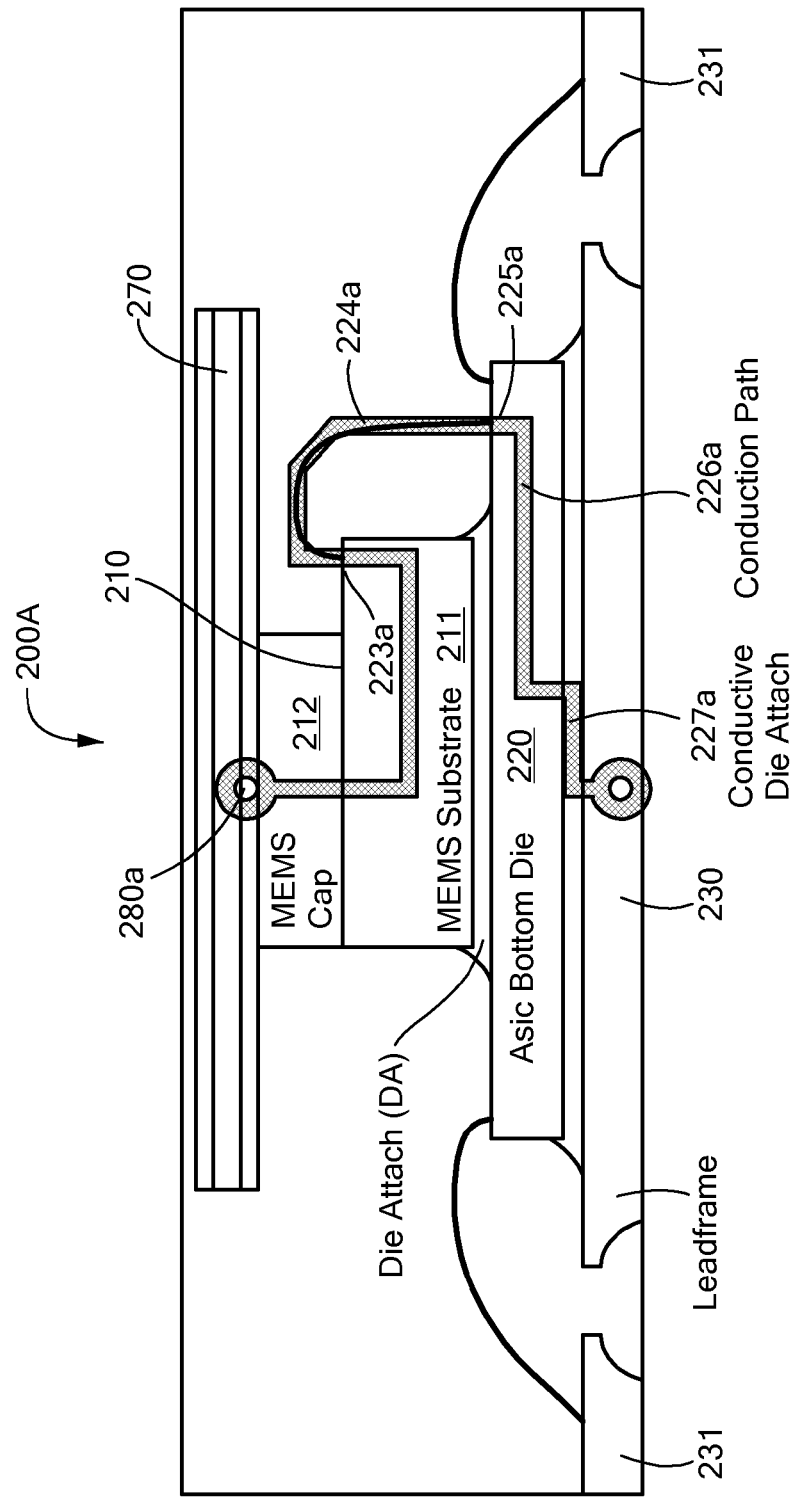
FIG. 2A shows an embodiment of a packaged MEMS device and associated integrated circuit wherein an electrical path, such as a grounding path or floating node is accentuated. As shown a common electrical node is formed between the conductive plate and the paddle of the lead frame.

FIG. 2A shows an embodiment of a packaged MEMS device 210 and associated integrated circuit 220 wherein an electrical path 280a, such as a grounding path or floating node is accentuated. As shown a common electrical node is formed between the conductive plate 270 and the paddle 230 of the lead frame 231. Embodiments of the lead frame may be constructed from metal, such as copper and may be stamped to have different connection points (I/O and ground pads) for mounting to a PCB. The paddle 230 may be connected to an external ground, such as the ground associated with the PCB or with the system into which the packaged chip is being mounted. The common electrical node 280a is formed by a path from the electrically conductive plate 270, through the electrically conductive MEMS cap 212 to the substrate 211 and a grounding node 223a of the MEMS substrate 211. The electrical node continues, from the grounding node 223a of the MEMS substrate through a wire bound 224a between grounding nodes between the MEMS device and the integrated circuit 225a. The path goes through the substrate 226a of the integrated circuit into the electrically conductive die attach 227a between the bottom of the integrated circuit and to the paddle 230 of the lead frame. In one embodiment of the invention the electrical path/node between the conductive plate and the paddle floats and does not have a fixed reference voltage level. In other embodiments, the paddle may be coupled to a high or low impedance to an external voltage, such as a local ground voltage or to a system ground voltage. With a low impedance from the coupling node to an external voltage, there is better noise performance, however this requires better shunting capability in the external system.

The electrically conductive plate may be sized in a variety of manners. Its main purpose is to protect the wire bound and the signal that the wire bond carries between the MEMS device and that of the integrated circuit. Thus, the larger the conductive plate is and the further it extends over and past the wire bond(s) that provide signals between the MEMS device and the integrated circuit, the less interference will impact the signal passing through the wire bond. For the present illustrations, the conductive plate is shown as a flat plate, however the plate may include one or more curved and/or angled sections. For example, the conductive plate might have a downwardly sloping angled section that extends past the MEMS cap that covers more of the surface area of the wire bond, than a simple flat plate. The conductive plate could also be shaped like an inverted bowl, again protecting more of the surface area of the wire bond and the I/O pads between the MEMS device and the integrated circuit than a purely flat plate.

Figure 2B:
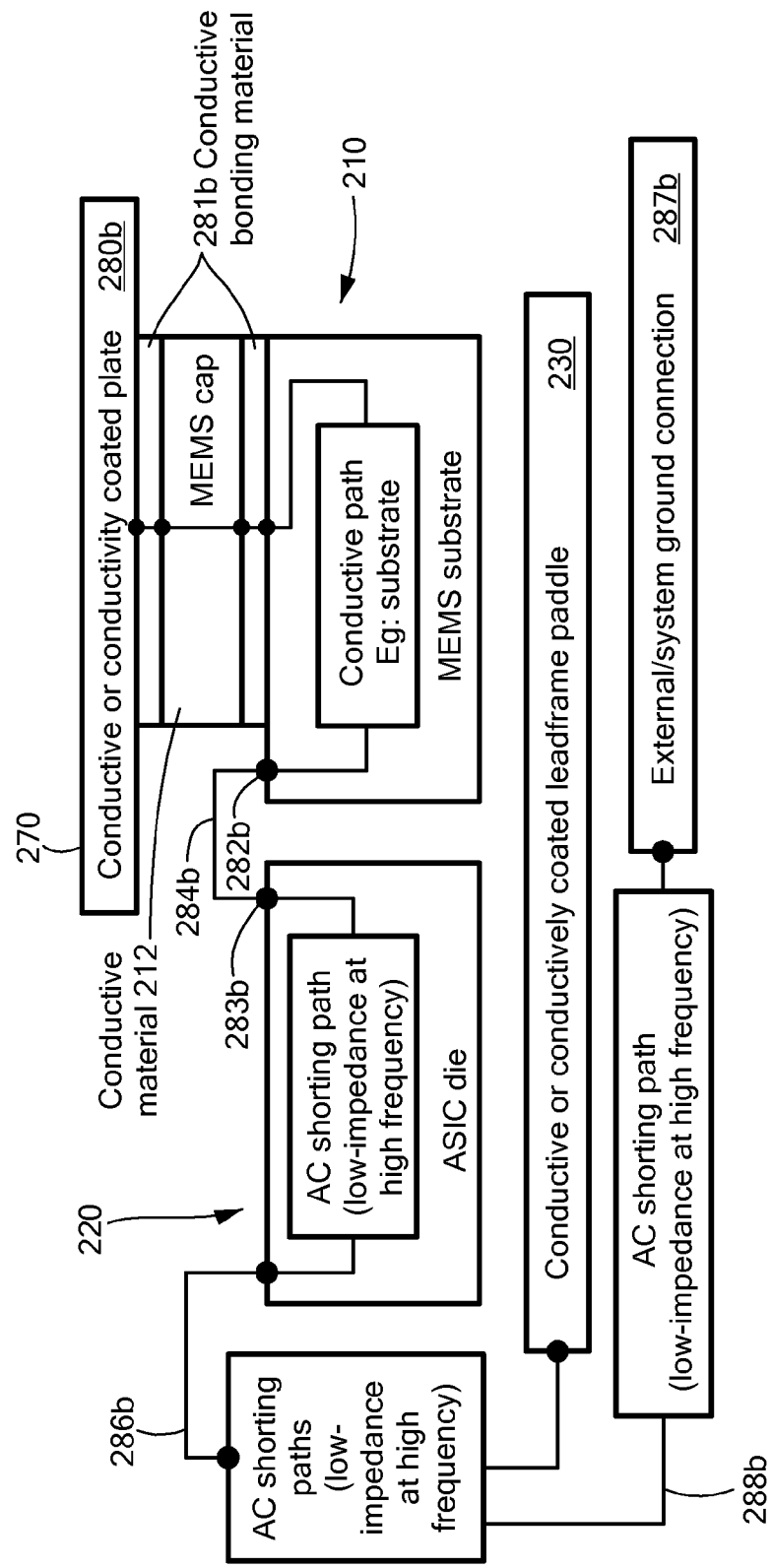
FIG. 2B shows a schematic embodiment including various connection paths of a MEMS device and integrated circuit with a conductive plate.

FIG. 2B shows a schematic embodiment including various connection paths of a MEMS device 210 and integrated circuit 220 with a conductive plate 270. In this schematic, the coupling path is shown, which establishes a low impedance path through the wire bond between the MEMS device and the integrated circuit. In this figure, the MEMS device 210 and the integrated circuit 220 are shown side-by-side. It should be noted that all of the variations of the present invention as shown in the figures can be applied equally to side-by-side and stacked embodiments of lead frame packages without deviating from the intended scope. As shown, there is a conductive plate 270. The conductive plate may be naturally conductive (e.g. metal) or may include one or more conductive coats of a conductive material. If EMI or RF interference reaches the conductive plate, the interference will be routed through the conductive plate to the paddle assuming that the path has a low impedance (at the frequencies of interest), creating a coupling path. The interference will be transferred through the conductive bonding material 281*b* through the MEMS cap through a second source of conductive bonding material 281*b* through the substrate of the MEMS device and will be transitioned through a grounding I/O pin 282*b* between of the MEMS device through a wire bond 284*b* to a grounding I/O pin 283*b* of the integrated circuit. The interference will continue from the integrated circuit through an electrical coupling (e.g. wire bond, conductive bonding material) to the conducive or conductively coated leadframe paddle 230. This conductive path 286*b* may be at a floating potential, coupled to a known potential or coupled to system ground 287*b*. In alternative embodiments there may be additional connections into the path 288*b*. For example there may be an extension to the path that is coupled in parallel with the leadframe paddle to an external or system ground connection. Additionally, the shown signal path may be varied in different embodiments. All embodiments share a conductive plate that is positioned to reduce EMI/RFI from coupling into the signal path between the output signals from the MEMS device into the integrated circuit. The embodiments also establish a node or common potential that includes the conductive plate.

Figure 1:
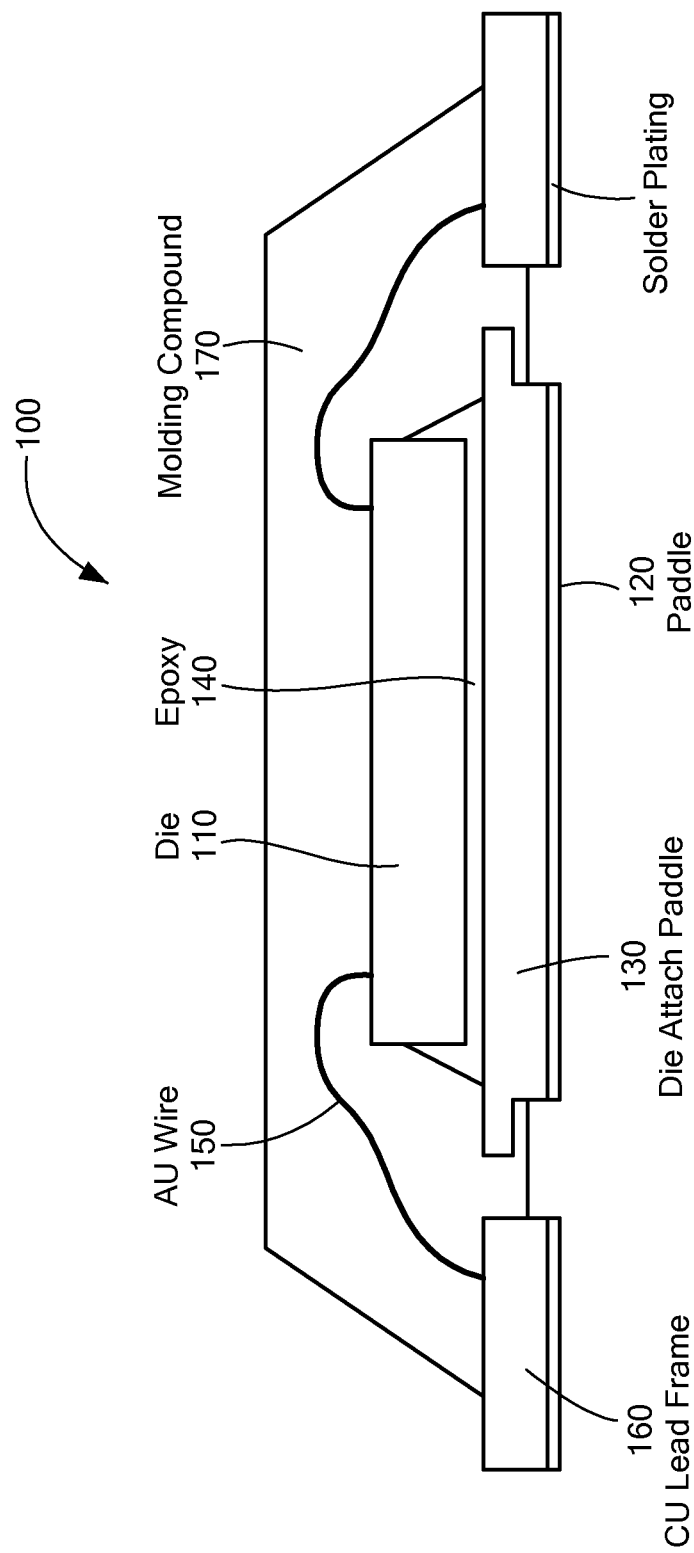
FIG. 1 is a prior art lead frame package for a die.
Figure 3:
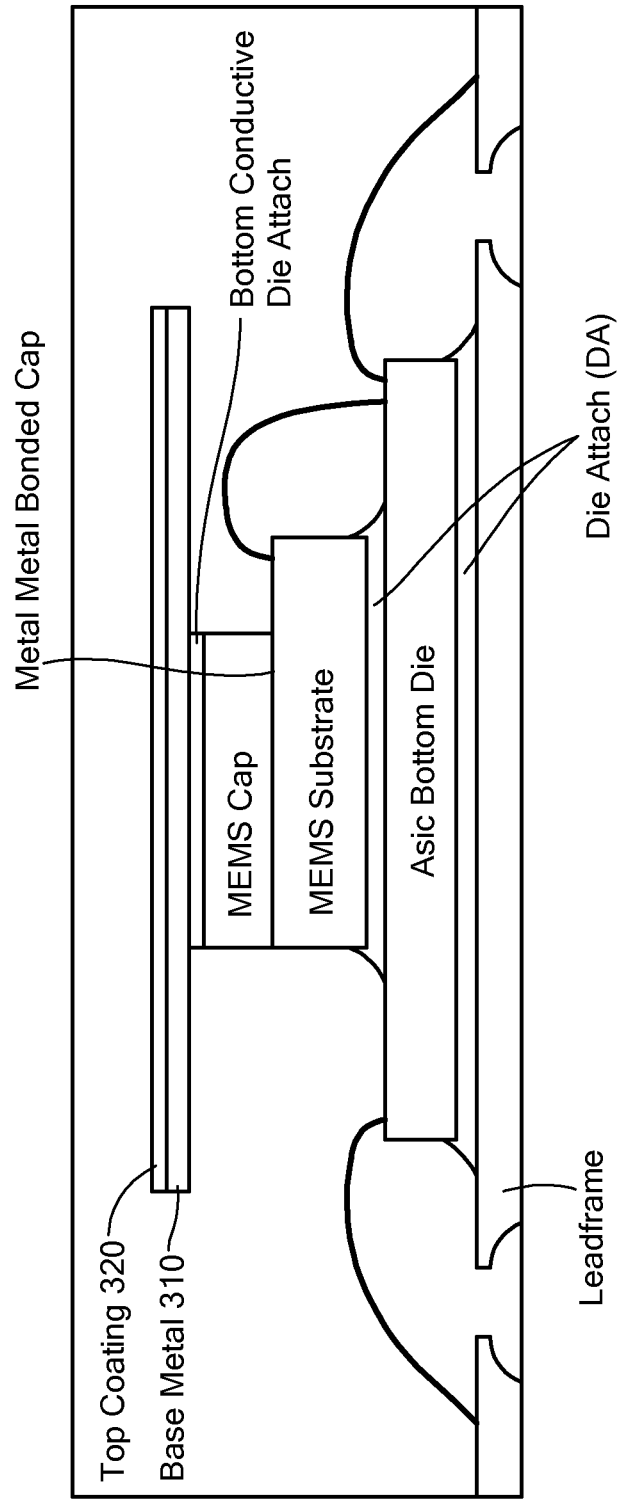
FIG. 3 shows an alternative embodiment of FIG. 1 including a conductive plate that includes both conductive and non-conductive materials.

FIG. 3 shows an alternative embodiment of FIG. 1 including a conductive plate that includes both conductive and non-conductive materials. The conductive plate may be formed from a non-conductive base material 310 and may be coated with a metallic or conductive coating 320 and then coupled into the low-potential (e.g. grounding path) path. The conductive plate may be made by sandwiching a non-conductive material with layers of conductive material. In other embodiments, the base layer itself may be conductive and may be coated with a conductive top coating that has a specific property. For example, the top coating may be less prone to corrosion or have better bonding properties with another portion of the packaged chip such as the MEMS cap or the conductive die attach.

Figure 4:
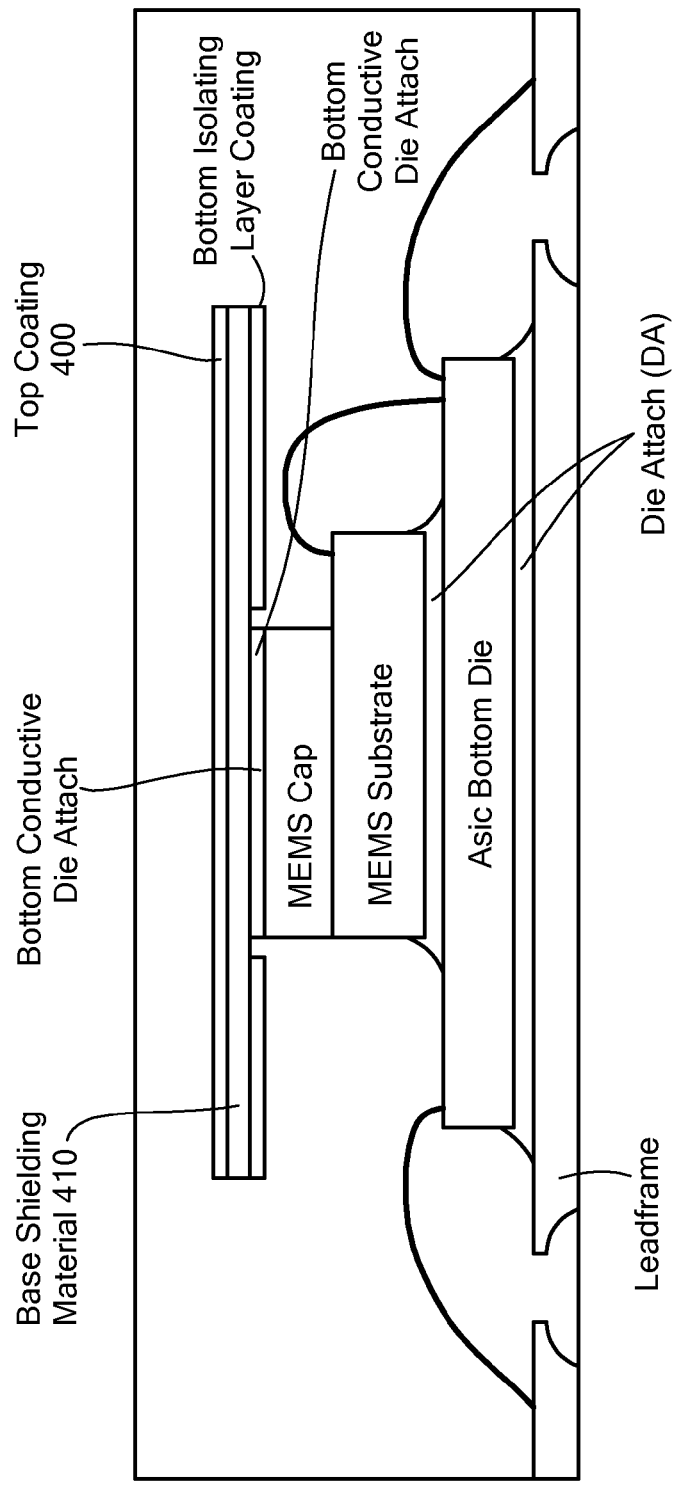
FIG. 4 shows another alternative embodiment wherein the conductive plate includes a base shielding material.

FIG. 4 shows another alternative embodiment wherein the conductive plate includes a base shielding material 410. In this variation, the conductive plate includes a non-conductive shielding material 410. This shielding material 410 prevents unwanted connections from occurring during the packaging process (i.e. assembly) and during use. For example, one could imagine that the conductive plate might flex and unintentionally come into contact with one of the wire bonds carrying the desired signal, thereby redirecting the desired signal. By adding this additional coating layer 410 to a portion of the bottom surface of the conductive beam, this shorting problem is avoided, while still providing a conductive path for reducing the EM and RF interference. The coating is added to the underside of the conductive beam that overhangs one or more of the dies (MEMS device or the integrated circuit). Thus, the conductive beam as shown forms a path with the conductive MEMS cap 420, which continues to a node, such as a grounding node on the paddle of the lead frame.

It should be recognized by one of ordinary skill in the art that each of the presented embodiments may be created using standard lead frame packaging techniques without requiring specialized equipment for creating the packaged chip.

Figure 5:
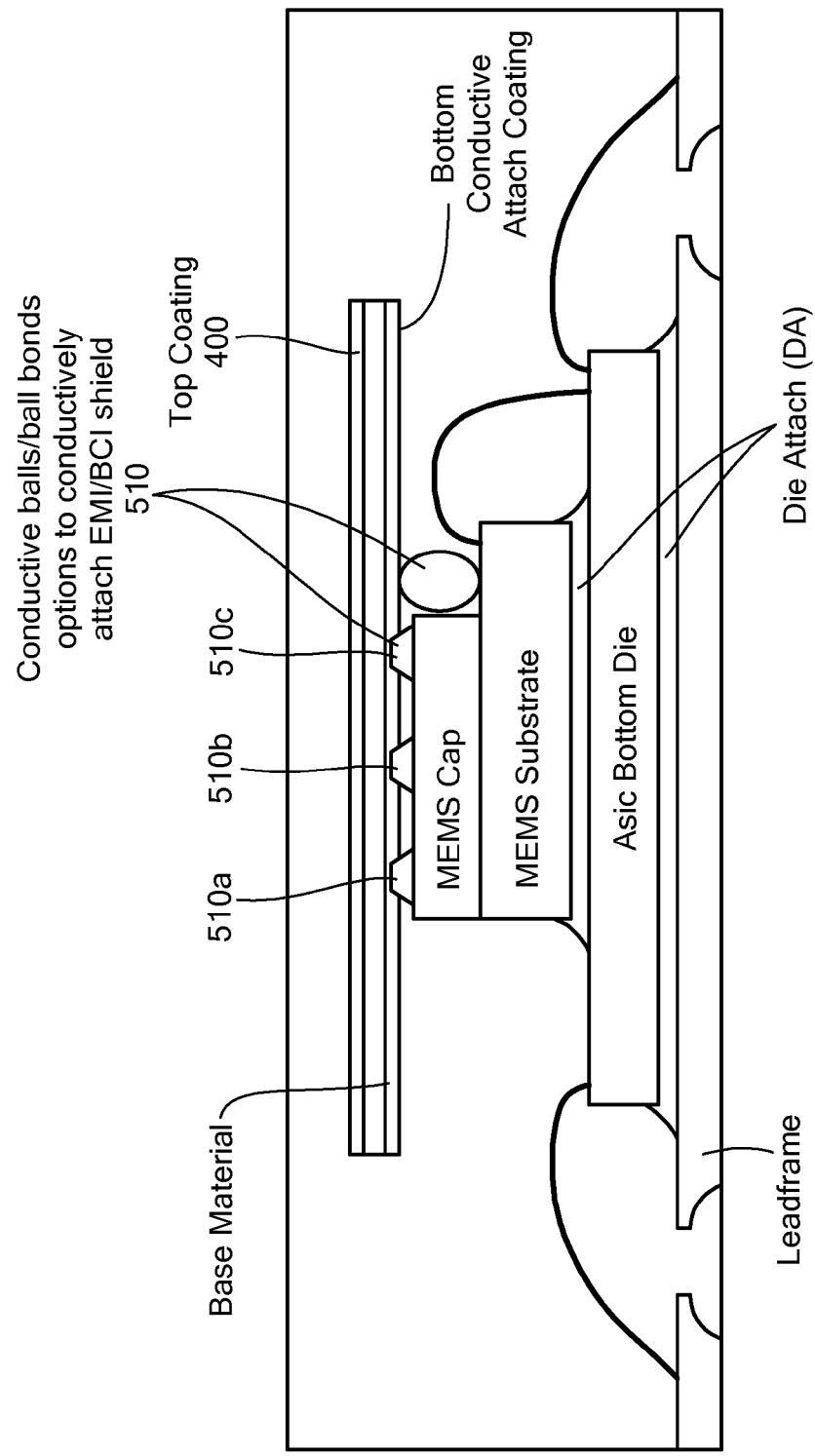
FIG. 5 shows an alternative embodiment wherein conductive ball bonds are used to connect the conductive plate to the cap of the MEMS device.

FIG. 5 shows an alternative embodiment wherein conductive ball bonds are used to connect the conductive plate to the cap of the MEMS device. These conductive ball bonds 510 may be used in place of or in addition to conductive die attach. These conductive ball bounds can be used to couple different elements within the low impedance path. As shown, there are ball bonds between the bottom surface of the conductive plate the conductive MEMS cap (510*a, b, c*). Additionally, there is a separate conductive ball bond 510*d* that couples the conductive plate with the MEMS substrate. One of ordinary skill in the art would recognize that there are other locations within the construction of a lead frame chip scale package that ball bonds might be used to either create or augment an electrical connection. The conductivity of the low impedance path (i.e. the coupling path) may be improved with the use of solder.

Figure 6:
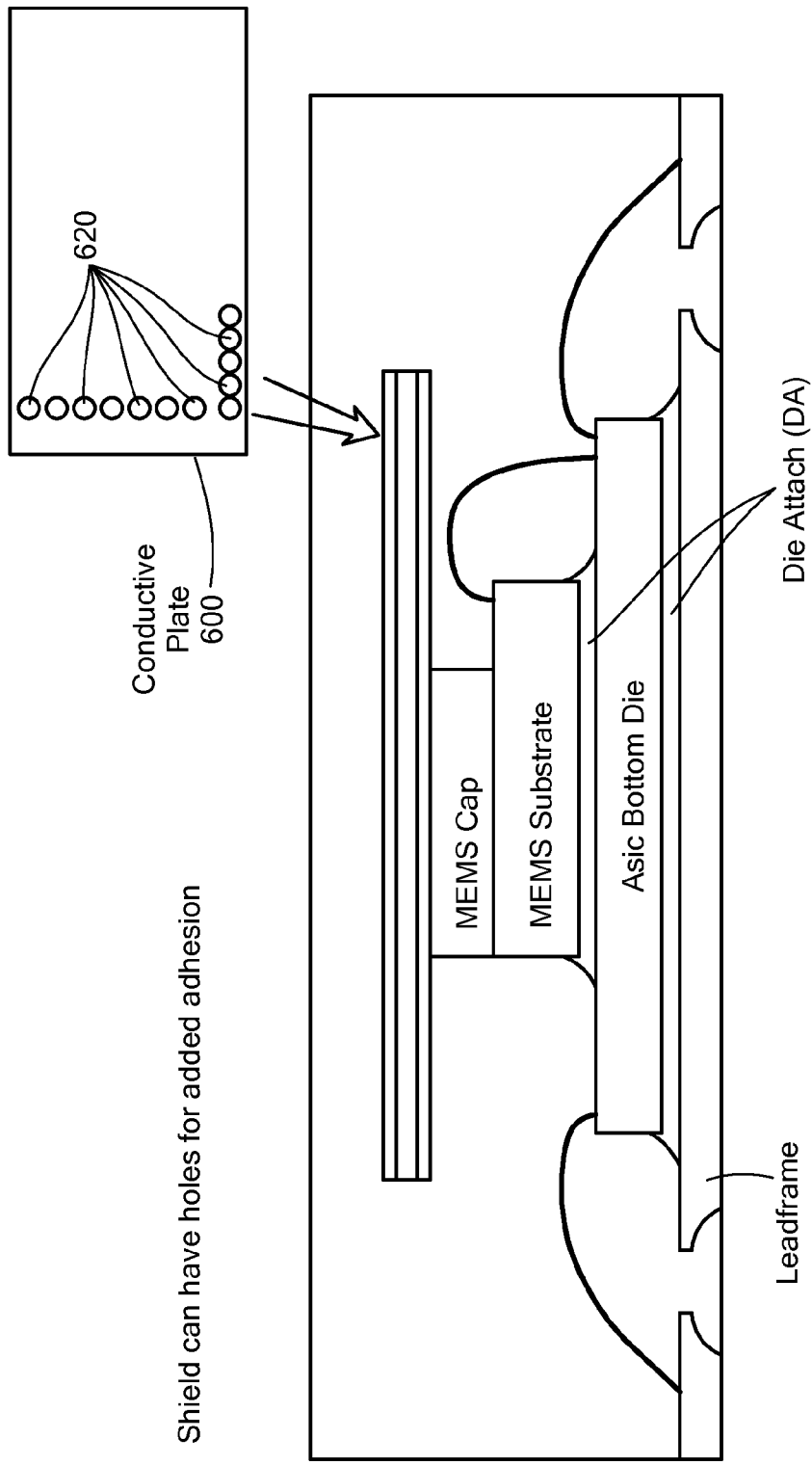
FIG. 6 shows a top view of the conductive plate that includes holes allowing for better adhesion.

FIG. 6 shows a top view of the conductive plate 600 that includes holes 620 allowing for better adhesion. In this variation, the conductive plate includes one or more holes that create additional surface area for adhesion. Additionally, the holes provide an area to stop any potential crack propagation, which could result in delamination of the connected area. During assembly of the package, the conductive plate 600 may be positioned on or above either the MEMS device or the integrated circuit or both in a side-by-side packaging configuration. The conductive plate may be coupled using conductive die attach and with the holes 620 in the conductive plate the die attach will push upwards through the holes and attach about the thickness of the holes. Additionally or in place of the conductive die attach the conductive ball bonds such as those shown in FIG. 5 may be used to couple the conductive plate to the common shielding node. The term low-voltage is used herein in reference to the desired signal level.

Figure 7:
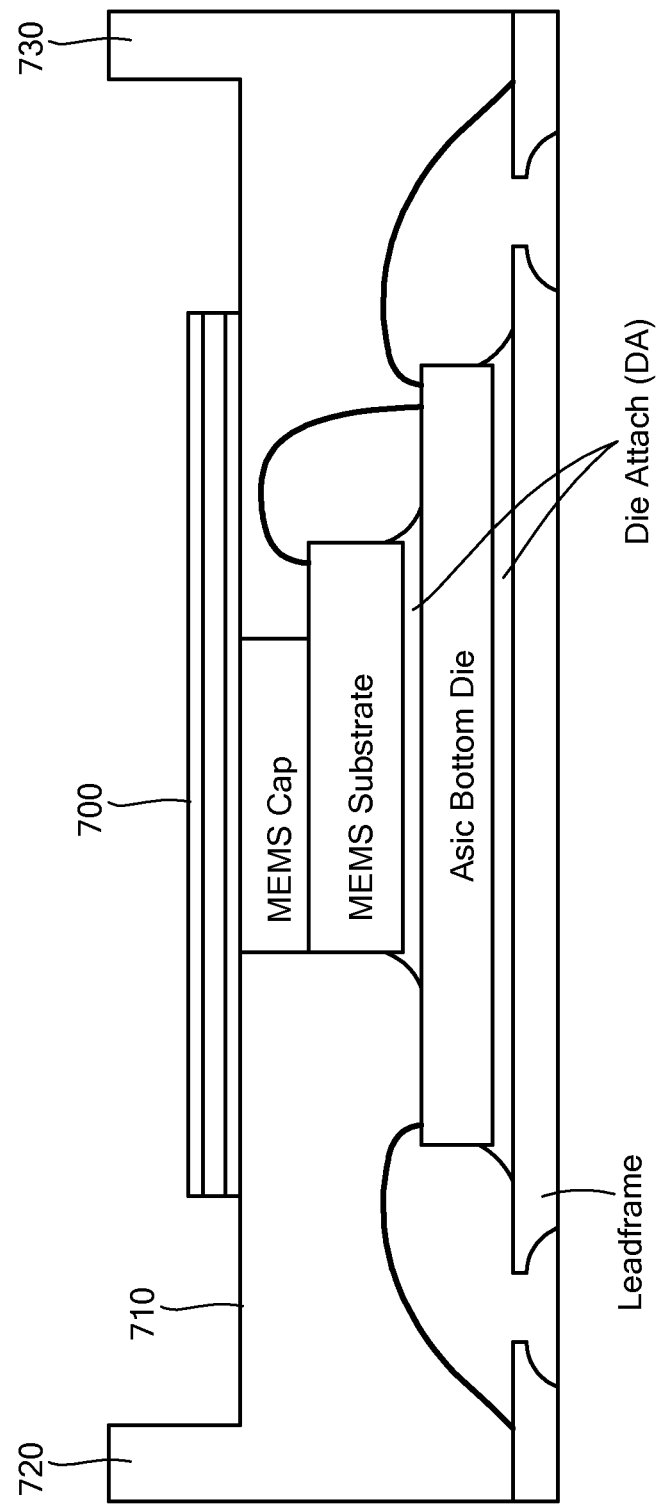
FIG. 7 shows an alternative embodiment of FIG. 1 wherein the conductive plate does not completely reside within the molding material.

FIG. 7 shows an alternative embodiment of FIG. 1 wherein the conductive plate 700 does not completely reside within the molding material 710 i.e. some of the conductive plate is exposed. In this embodiment, the conductive plate 700 may be attached to the package after the molding material 710 is added. In some embodiments the molding material may cover the location to which the conductive plate is to be electrically coupled and the molding material may be removed from that location during the assembly process using etching and/or other techniques. Conductive die attach may be added and the conductive plate attached to the package using the conductive die attach. As shown, the molding material extends above the conductive plate, such that the molding material forms side walls 720, 730. The conductive plate sits within a contour formed by the molding material and the side walls provide a barrier between the conductive plate and any other electrical couplings of the system into which this lead frame chip scale package is placed.

Figure 8:
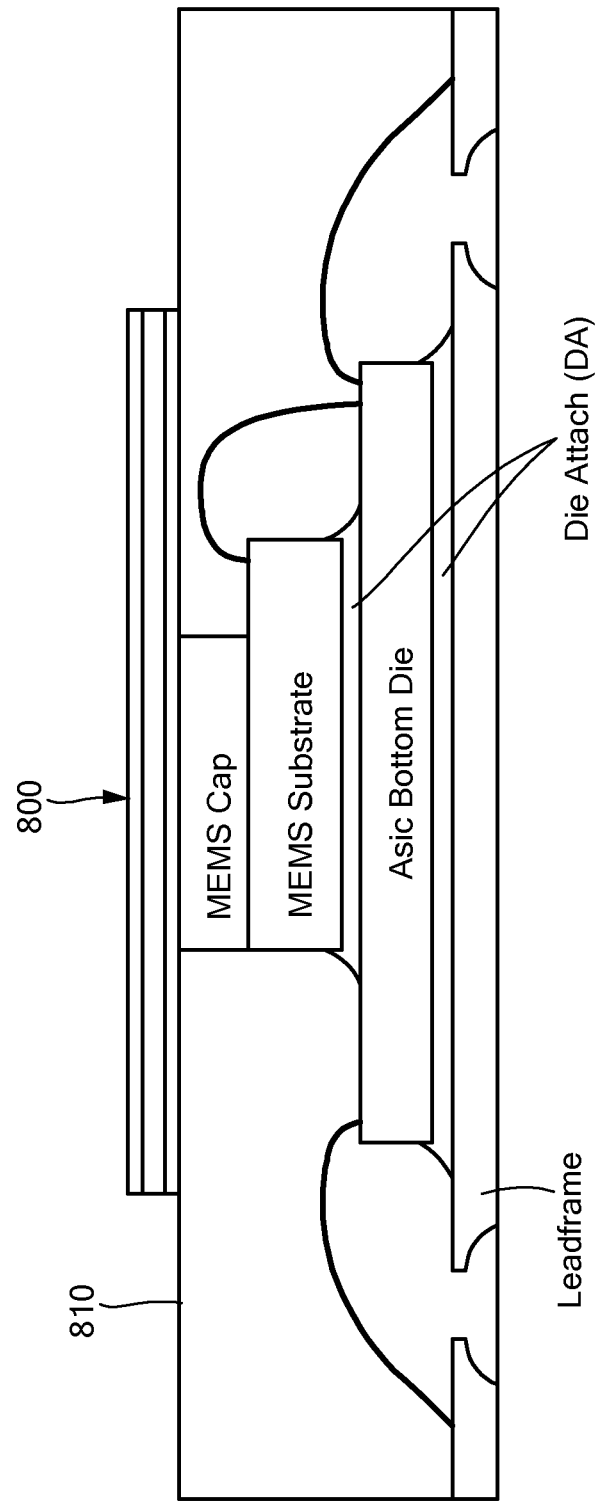
FIG. 8 shows an alternative embodiment of FIG. 1 wherein the conductive plate is exposed above the molding material.

FIG. 8 shows an alternative embodiment of FIG. 1 wherein the conductive plate is exposed above the molding material. In this embodiment of the invention, at least a portion of the conductive plate 800 resides on top of the molding material 810. In the formation of the packaged device, the molding material 810 is added such that the top surface of at least one of the electrical devices (e.g. the MEMS device or the integrated circuit) is exposed and not covered. The top of the molding material and the top of the device (e.g. the MEMS cap in FIG. 8) reside within the same plane. Thus, die attach can be easily added and the conductive plate attached. It should be recognized that the conductive plate need not be made completely of conductive material and may simply be coated with a conductive material. The conductive plate needs only to be capable of conducting the RF and EMI interference away from the I/O pads between the MEMS device and the integrated circuit and the wire bond connection for the desired signal and thus, does not need to be completely conductive.

Figure 9:
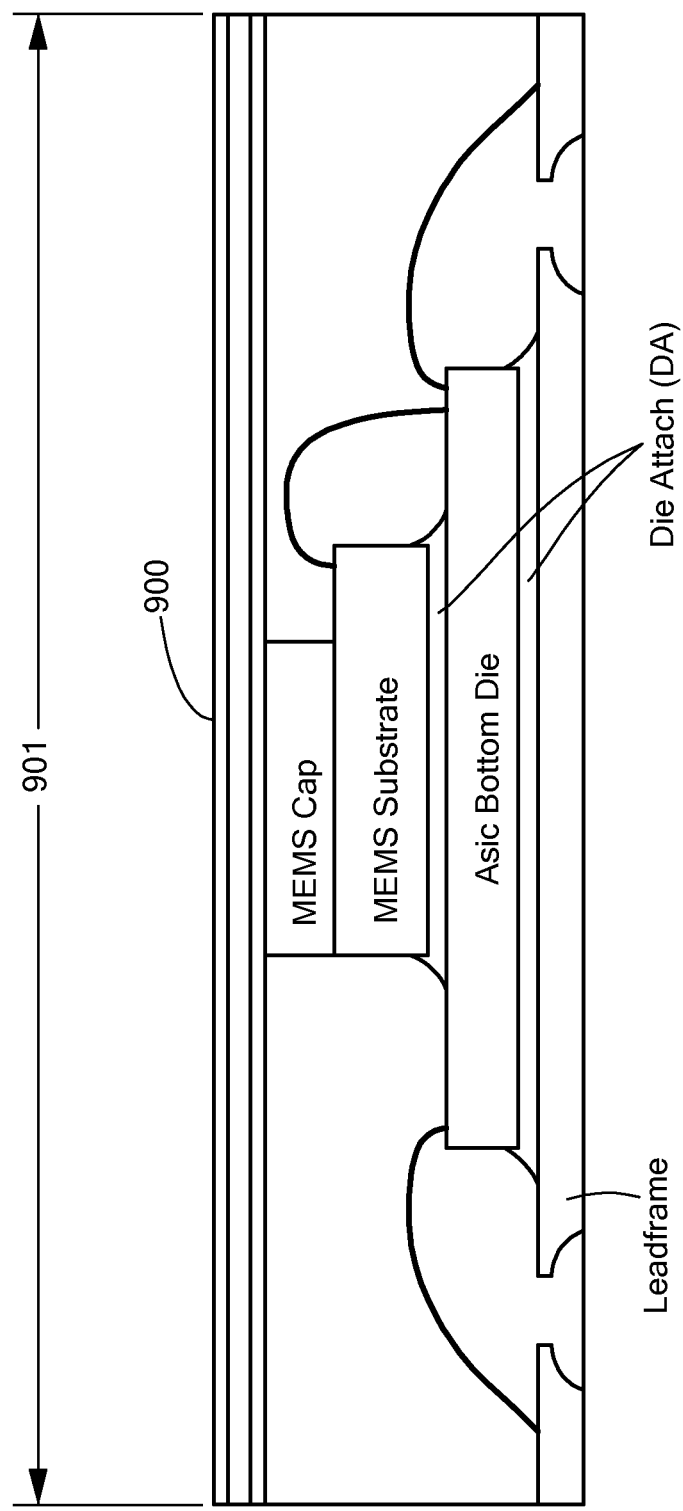
FIG. 9 shows an embodiment in which the conductive plate extends the length of the package.

FIG. 9 shows an embodiment in which the conductive plate 900 extends the length 901 of the package. In this embodiment, the conductive plate extends beyond the wire bond connection and the I/O ports between the MEMS device and the integrated circuit. The further that the conductive plate extends the greater the increase in EMI and RF noise rejection/removal from the desired inter-chip signal path.

Figure 10:
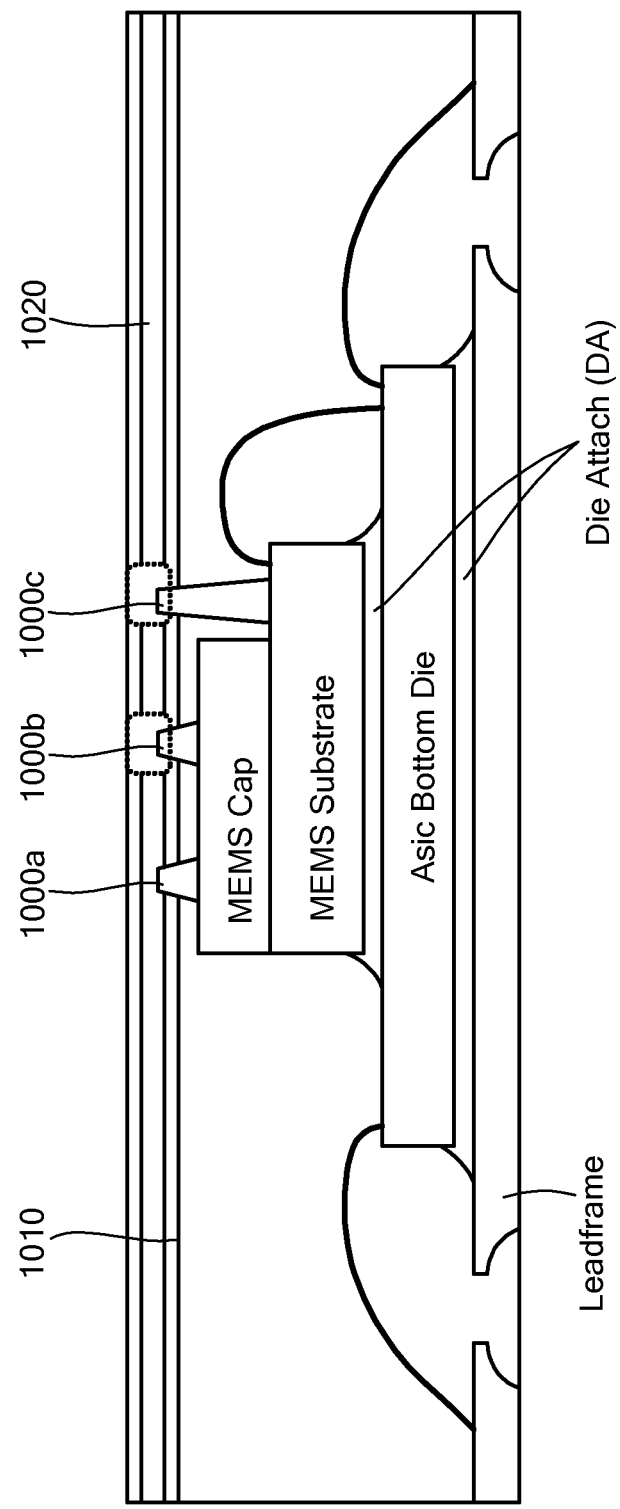
FIG. 10 shows an embodiment of the invention in which there are exposed wire bonds or bumps.
Figure 11:
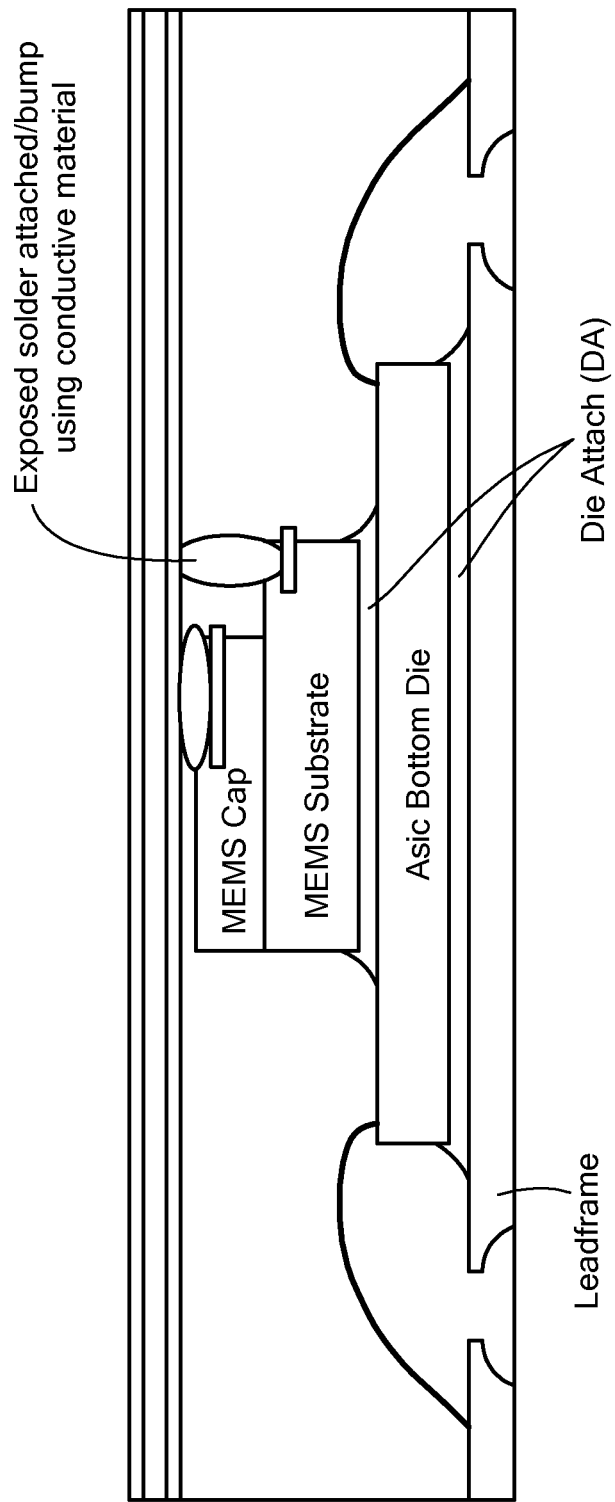
FIG. 11 shows the conductive plate electrically coupled to the MEMS device using solder balls.

FIG. 10 shows an embodiment of the invention in which there are exposed wire bonds or bumps 1000 (1000a,b,c). In this embodiment, the packaged device is constructed so that there are exposed conductive ball bonds that protrude through the molding material 1010. These solidified ball bonds can then be partially liquefied and the conductive plate 1020 can be added to the top of the package. As shown, the ball bonds may be coupled to one or more locations on the various dies. Two of the ball bonds are coupled to the MEMS cap 1000a,b and another ball bond 1000c is coupled to the MEMS substrate. Other possible locations for placement of the ball bonds would be at grounding i/o pins of the MEMS device and/or the integrated circuit. In a similar fashion to the ball bonds of FIG. 10, FIG. 11 shows the conductive plate electrically coupled to the MEMS device using solder balls.

Although the above discussion discloses various exemplary embodiments of the invention, it should be apparent that those skilled in the art can make various modifications that will achieve some of the advantages of the invention without departing from the true scope of the invention.

What is claimed is:

1. A packaged electronic chip, comprising:
   a MEMS device having a conductive cap, a MEMS semiconductor substrate, and an output pad outputting an alternating current signal when the MEMS device is actuated;
   an integrated circuit having an input pad for receiving the alternating current signal;
   a wire bond coupling between the integrated circuit and the MEMS device;
   a mechanism including a conductive plate electrically coupled to the conductive cap of the MEMS device and a conductive paddle electrically coupled to the MEMS device that shields the input pad, the output pad and/or the wire bond creating a local voltage reference between the conductive plate and the conductive paddle through the MEMS semiconductor substrate and the conductive cap of the MEMS device, the local voltage reference fluctuating with electro-magnetic interference; and
   molding material covering at least a portion of the integrated circuit, the wire bond, and the MEMS device.

2. A packaged electronic chip according to claim 1 wherein the conductive plate and the conductive paddle act as a faraday cage reducing electro-magnetic interference from reaching the input pad, the wirebond, and/or the output pad.

3. A packaged electronic chip according to claim 1 wherein the MEMS device and the integrated circuit are stacked within the molding material.

4. A packaged electronic chip according to claim 1 wherein the MEMS device and the integrated circuit are arranged side-by-side.

5. A packaged electronic chip according to claim 1 wherein the conductive plate is encapsulated in the molding material.

6. A packaged electronic chip according to claim 1 wherein the packaged electronic chip is packaged in a lead frame package.

7. A system comprising:
   a printed circuit board having a plurality of predefined input/output nodes including at least one grounding node; and
   a leadframe packaged chip including a leadframe having one or more input/output pads and a ground pad; the leadframe packaged chip including:
   a MEMS device including a MEMS semiconductor substrate and a conductive cap;
   an integrated circuit having a semiconductor substrate;
   a wire bond electrically coupling a signal path between the integrated circuit and the MEMS device;
   an electrically conductive plate that resides above the wire bond, wherein the conductive plate forms a low impedance path through the conductive cap of the MEMS device and the semiconductor substrate of the MEMS device, the semiconductor substrate of the integrated circuit and to the ground pad and wherein the ground pad is configured to be mounted to the grounding node of the printed circuit board and the input/output pads are positioned to be mounted with the predefined input/output nodes of the printed circuit board.

8. A system according to claim 7 wherein the ground pad is a conductive paddle.

9. A system according to claim 8 wherein the conductive plate and the conductive paddle act as a faraday cage reducing electro-magnetic interference from reaching the input pad, the wirebond, and/or the output pad.

10. The system according to claim 8 wherein the conductive plate forms at least a portion of a top surface of the leadframe packaged chip and wherein a bottom surface includes the conductive paddle.

11. A system according to claim 7 wherein the MEMS device and the integrated circuit are stacked.

12. A system according to claim 7 wherein the leadframe packaged chip includes a molding material.

13. A system according to claim 12 wherein the molding material is an electrical insulator.

14. A system according to claim 12 wherein the conductive plate is encapsulated in the molding material.

15. The system according to claim 12 wherein the conductive plate resides on top of the molding material.

16. The system according to claim 12 wherein the conductive plate is at least partially exposed through the molding material.

17. A system according to claim 7 wherein the MEMS device and the integrated circuit are arranged side-by-side.

* * * * *